United States Patent
Kondo et al.

(10) Patent No.: US 6,599,769 B2
(45) Date of Patent: Jul. 29, 2003

(54) PROCESS FOR MOUNTING DEVICE AND OPTICAL TRANSMISSION APPARATUS

(75) Inventors: Takayuki Kondo, Suwa (JP); Tatsuya Shimoda, Suwa (JP); Atsushi Sato, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/895,824

(22) Filed: Jun. 29, 2001

(65) Prior Publication Data

US 2002/0055200 A1 May 9, 2002

(30) Foreign Application Priority Data

Jun. 30, 2000 (JP) ......................................... 2000-199985

(51) Int. Cl.$^7$ ............................................... H01L 21/00
(52) U.S. Cl. ........................... 438/28; 438/26; 438/107; 438/118
(58) Field of Search ................................ 438/107, 118, 438/26, 28; 257/618, 622, 623

(56) References Cited

U.S. PATENT DOCUMENTS

| 5,545,291 A | 8/1996 | Smith |
| 5,783,856 A | 7/1998 | Smith |
| 5,824,186 A | 10/1998 | Smith |
| 5,904,545 A | 5/1999 | Smith |

FOREIGN PATENT DOCUMENTS

JP         11-289317         10/1999

Primary Examiner—Long Pham
(74) Attorney, Agent, or Firm—Harness, Dickey & Pierce, P.L.C.

(57) ABSTRACT

An optical transmission apparatus applicable to an optical interconnection apparatus for interconnection between stacked IC chips, and a process of mounting elements for manufacturing such an apparatus are disclosed. For example, light emitting elements (2a, 2b), each having a surface emitting laser of a different wavelength, are respectively formed on trapezoidal microstructures (7a, 7b) having different sizes, and light receiving elements (3a, 3b), each having a filter for receiving light in the wavelength range of each light emitting element, are respectively formed on trapezoidal microstructures (8a, 8b) having different sizes. On substrates (4a to 4c) having concave portions (5a, 5b, 6a, 6b) which have forms identical to those of the microstructures and are formed at positions where the light emitting and receiving elements are provided, a slurry including the microstructures is made to flow, thereby each microstructure is fit into the corresponding concave portion due to gravity.

7 Claims, 6 Drawing Sheets

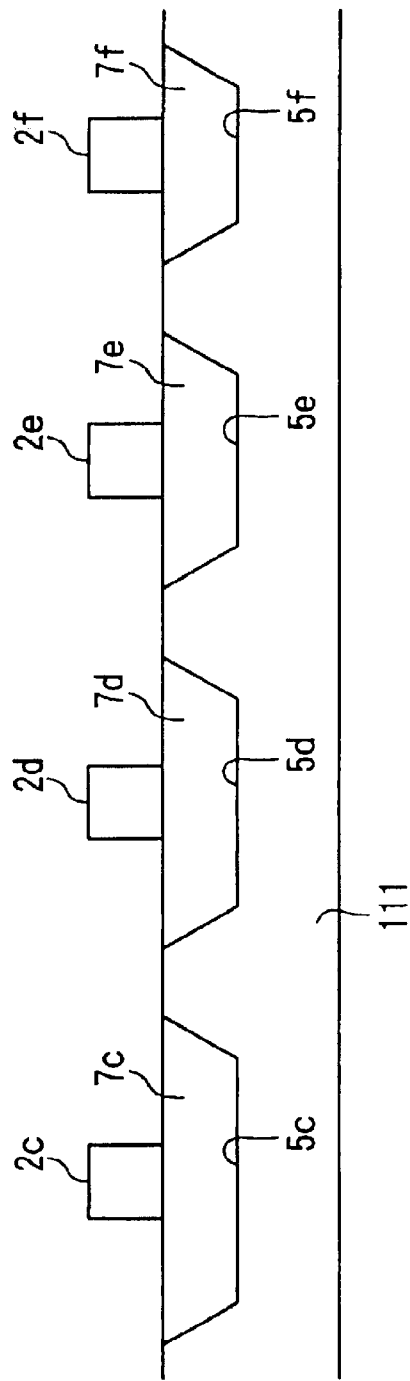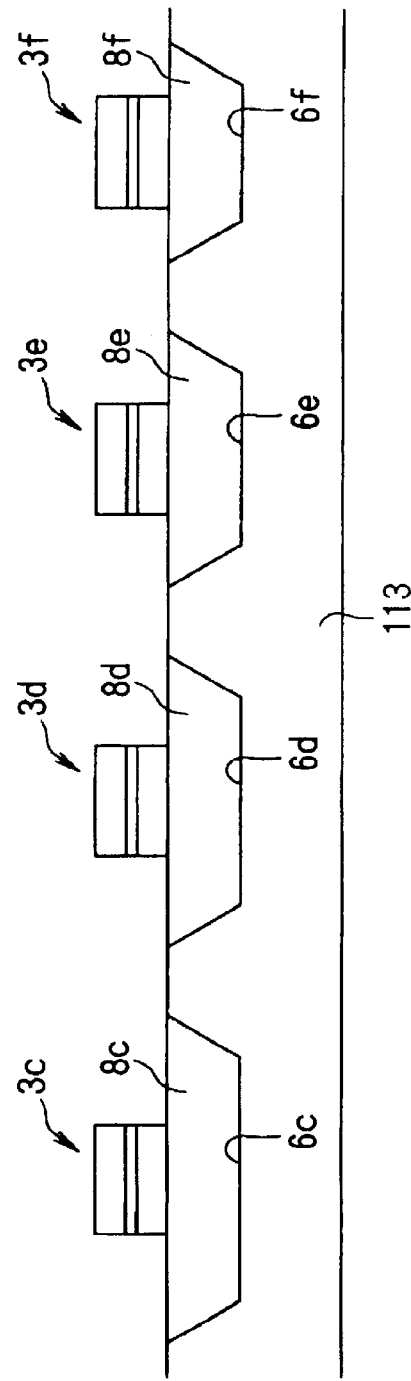

PROCESS FOR MOUNTING DEVICE AND OPTICAL TRANSMISSION APPARATUS

BACKGROUND OF THE INVENTION

1. Field of the Invention

The present invention relates to a process of mounting elements and an optical transmission apparatus having elements mounted using this method, for example, an optical interconnection apparatus performing optical interconnection between stacked IC chips employed by a one-chip computer or the like.

2. Description of the Related Art

In order to further improve the operation speed of computers, a one-chip computer has been proposed, which comprises stacked IC chips (e.g., CPU, DRAM, and the like) between which data is transmitted and received using optical signals. Typically, in an optical interconnection apparatus employed by such a one-chip computer, each IC chip is stacked in a manner such that one IC chip (e.g., light emitting element) and another IC chip (e.g., light receiving element) face each other. According to this example, light emitted from an IC chip (i.e., the light emitting element) can be directly received by another IC chip. Accordingly, high-speed data transmission can be realized by transmitting data with such light. Furthermore, if a plurality of IC chips, each having a light receiving element, are stacked, then an optical signal transmitted from a light emitting element can be received by a plurality of light receiving elements. That is, data from a single IC chip can be simultaneously transmitted to a plurality of IC chips, thereby realizing a very high-speed optical bus.

In order to perform parallel data transmission between chips, each signal path must be independent. However, the IC chips are very small; thus, optical signals may leak from the relevant paths, thereby generating so-called crosstalk. It is very difficult and impractical to form an optical waveguide between stacked IC chips so as to solve this problem. Therefore, in order to perform parallel data transmission between chips, it is effective to assign a different signal form, that is, a different wavelength, to each optical signal path.

Here, light emitting diodes, surface emitting lasers, and the like, as light emitting elements, and photodiodes as light receiving elements, are each formed on a semiconductor substrate. It is impossible to assign different optical characteristics, in particular, to form elements having different optical characteristics on a specific portion on the same substrate. Therefore, each light emitting or receiving element must be directly mounted on an IC chip.

A vertical cavity surface emitting laser having a small aperture for light emission is an example of the light emitting element mounted on an IC chip. The size of such a surface emitting laser is sufficiently small as a light emitting element mounted on an IC chip, and this surface emitting laser emits light in a vertical direction. Therefore, if the surface emitting laser can be mounted on the substrate of the IC chip, then the surface emitting laser can immediately emit light to another IC chip mounted in a stacked form. In addition, photodiodes are also sufficiently small as light receiving elements mounted on an IC chip.

However, it is difficult to mount such small light emitting or receiving elements on the base of an IC chip in a highly-integrated structure. Additionally, in order to form an optical bus between stacked IC chips, relevant light emitting and receiving elements must be precisely mounted at each predetermined position on the IC chip. However, it is very difficult to precisely mount these elements in a highly-integrated structure as described above.

SUMMARY OF THE INVENTION

In order to solve the above problems, an object of the present invention is to provide a process of mounting elements and an optical transmission apparatus having elements mounted by this method, which can be applied to an optical interconnection apparatus for optical interconnection between stacked IC chips or the like.

Therefore, a process of mounting elements according to a first aspect of the present invention comprises the steps of:

forming concave portions having different forms at predetermined positions on a surface of a base;

forming microstructures on which elements having different functions are provided and which have different forms identical to the forms of the concave portions;

creating a slurry by putting the microstructures, on which the elements are provided, into a fluid; and fitting the microstructures into the concave portions having the identical forms by making the slurry flow on the surface of the base.

In a process of mounting elements according to a second aspect related to the first aspect of the present invention, slurries, which respectively include the microstructures in order of size from largest to smallest, are made to flow in turn on the surface of the base.

An optical transmission apparatus according to a third aspect of the present invention comprises elements mounted by using a process according to the first or second aspect, wherein the elements which have different functions and are mounted at said predetermined positions on the surface of the base are light emitting elements, each of which emits light of a different wavelength.

An optical transmission apparatus according to a fourth aspect of the present invention comprises elements mounted by using a process according to the first or second aspect, wherein the elements which have different functions and are mounted at said predetermined positions on the surface of the base are light receiving elements, each of which receives light of a different wavelength.

In an optical transmission apparatus according to a fifth aspect related to the fourth aspect of the present invention, the light receiving elements are photodiodes, each having a light receiving surface on which a band-pass filter is provided.

In an optical transmission apparatus according to a sixth aspect of the present invention, the base included in an optical transmission apparatus related to the third aspect and the base included in an optical transmission apparatus related to the fourth aspect are stacked in a manner such that the light emitting elements included in the optical transmission apparatus related to the third aspect respectively face the light receiving elements included in the optical transmission apparatus related to the fourth aspect.

In an optical transmission apparatus according to a seventh aspect of the present invention, the base included in an optical transmission apparatus related to the third aspect and the base included in an optical transmission apparatus related to the fifth aspect are stacked in a manner such that the light emitting elements included in the optical transmission apparatus related to the third aspect respectively face the light receiving elements included in the optical transmission apparatus related to the fifth aspect.

The process of mounting elements according to the first aspect of the present invention comprises the steps of forming concave portions having different forms at predetermined positions on a surface of a base; forming microstructures on which elements having different functions are provided and which have different forms identical to the forms of the concave portions; creating a slurry by putting the microstructures, on which the elements are provided, into a fluid; and fitting the microstructures into the concave portions having the identical forms by making the slurry flow on the surface of the base. Therefore, when the forms of the concave portions agree with the forms of the corresponding microstructures, elements having different functions can be mounted at a very high density. When the forms and positions of the concave portions are precise, the elements can be very precisely mounted on the base.

In the process of mounting elements according to the above second aspect, slurries, which respectively include the microstructures in order of size from largest to smallest, are made to flow in turn on the surface of the base. Therefore, the probability of a small microstructure being placed into a larger concave portion is small, and accordingly, the elements can be more precisely mounted.

The optical transmission apparatus according to the above third aspect comprises elements mounted by using a process according to the first or second aspect, wherein the elements which have different functions and are mounted at said predetermined positions on the surface of the base are light emitting elements, each of which emits light of a different wavelength. Therefore, it is possible to manufacture an IC chip in which the light emitting elements have been mounted; the IC chip can be applied to an optical interconnection apparatus for performing optical interconnection between stacked IC chips.

The optical transmission apparatus according to the above fourth aspect comprises elements mounted by using a process according to the first or second aspect, wherein the elements which have different functions and are mounted at said predetermined positions on the surface of the base are light receiving elements, each of which receives light of a different wavelength. Therefore, it is possible to manufacture an IC chip in which the light receiving elements have been mounted; the IC chip can be applied to an optical interconnection apparatus for optical interconnection between stacked IC chips.

In the optical transmission apparatus according to the above fifth aspect, the light receiving elements are photodiodes, each having a light receiving surface on which a band-pass filter is provided. Therefore, it is possible to easily form the light receiving elements having a filtering function, by which independent signal paths can be formed; such independent signal paths are necessary for performing parallel data transmission of an optical interconnection apparatus for optical interconnection between stacked IC chips.

In the optical transmission apparatus according to the sixth or seventh aspect, the base included in an optical transmission apparatus related to the third aspect and the base included in an optical transmission apparatus related to the fourth or fifth aspect are stacked in a manner such that the light emitting elements included in the optical transmission apparatus related to the third aspect respectively face the light receiving elements included in the optical transmission apparatus related to the fourth or fifth aspect. Therefore, an optical interconnection apparatus for optical interconnection between stacked IC chips can be easily realized.

BRIEF DESCRIPTION OF THE DRAWINGS

FIGS. 6A and 6B are diagrams, each showing a state in which elements having different functions are mounted on a substrate by using microstructures having different forms.

DESCRIPTION OF THE PREFERRED EMBODIMENTS

Figure 1:
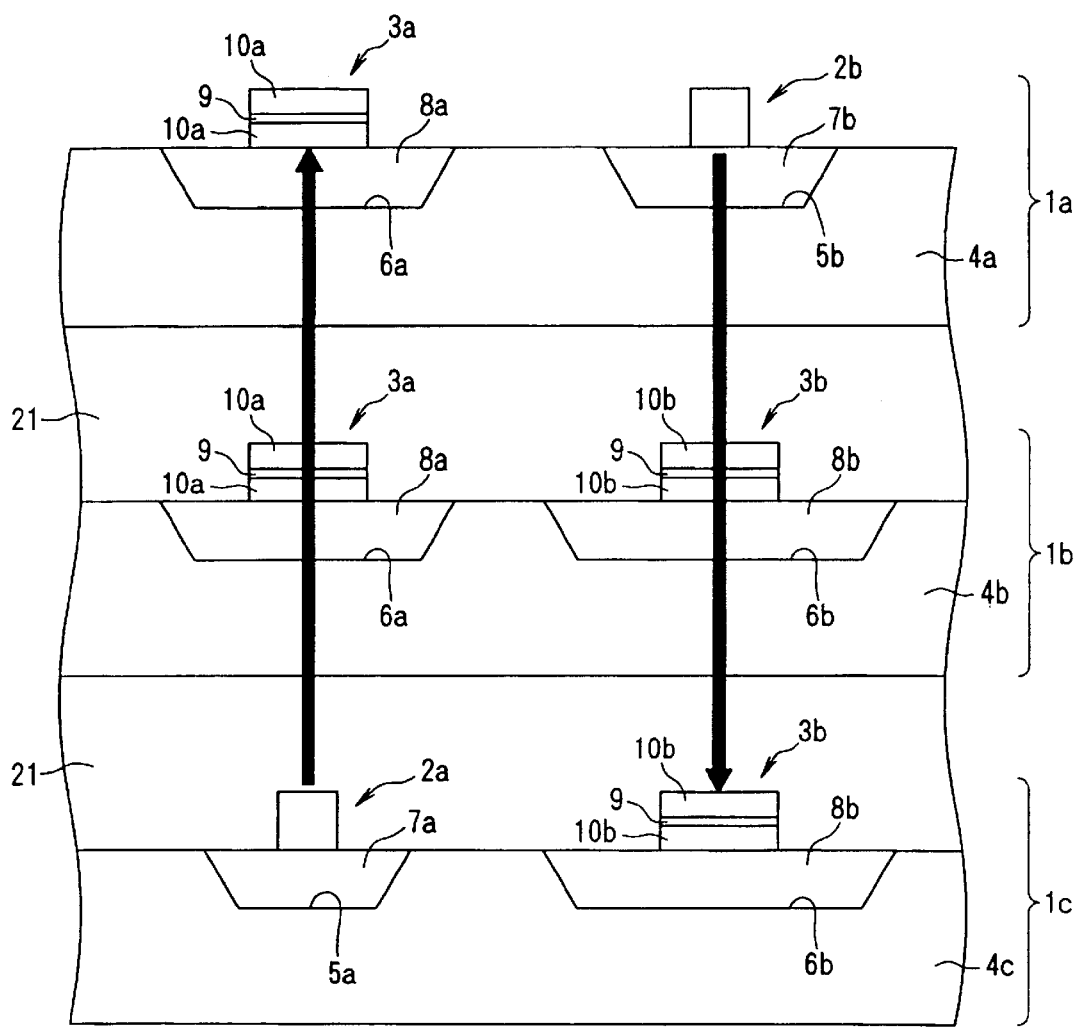
FIG. 1 is a diagram showing the general structure of an optical interconnection apparatus for optical interconnection between stacked IC chips, as an embodiment according to the present invention.

Hereinafter, embodiments according to the present invention will be explained. FIG. 1 is a diagram showing the general structure of an optical interconnection apparatus for performing optical interconnection between stacked IC chips. In this embodiment, three layers of IC chips (here, LSI chips) 1a to 1c, such as a CPU, DRAM, and the like, are stacked.

In the present embodiment, (i) light emitted from a light emitting element 2a of the IC chip 1c in the illustrated lowest layer is received by light receiving elements 3a which are provided in the IC chips 1b and 1a in the corresponding middle and highest layers, and (ii) light emitted from a light emitting element 2b of the IC chip 1a in the illustrated highest layer is received by light receiving elements 3b which are provided in the IC chips 1b and 1c in the corresponding middle and lowest layers. Accordingly, the wavelength of light emitted from one light emitting element 2a differs from the wavelength of light emitted from the other light emitting element 2b, and the wavelength range of light received by one light receiving element 3a differs from the wavelength range of light received by the other light receiving element 3b. In this embodiment, (i) substrates (i.e., bases) 4a to 4c of the IC chips 1a to 1c and (ii) microstructures 7a to 8b are made of Si. Therefore, a wavelength of more than 1.0 μm, preferably 1.1 μm, is selected for light emitted from each light emitting element. Si has a large absorption coefficient of approximately 100 cm$^{-1}$ and an appropriate loss with respect to the wavelength of 1.0 μm. However, in a wavelength range of more than 1.1 μm, the absorption coefficient is small, such as less than 10 cm$^{-1}$. Therefore, in the present embodiment, the wavelength of the optical signal of each light emitting element is defined as more than 1.0 μm, preferably 1.1 μm. The optical signal having a wavelength which satisfies the above condition can easily transmit Si, thereby smoothly transmitting an optical signal between a light emitting element and a light receiving element which face each other. An adhesive (layer) 21 which will be explained below also has transmissive characteristics with respect to the above-defined optical wavelength range.

Figure 2:
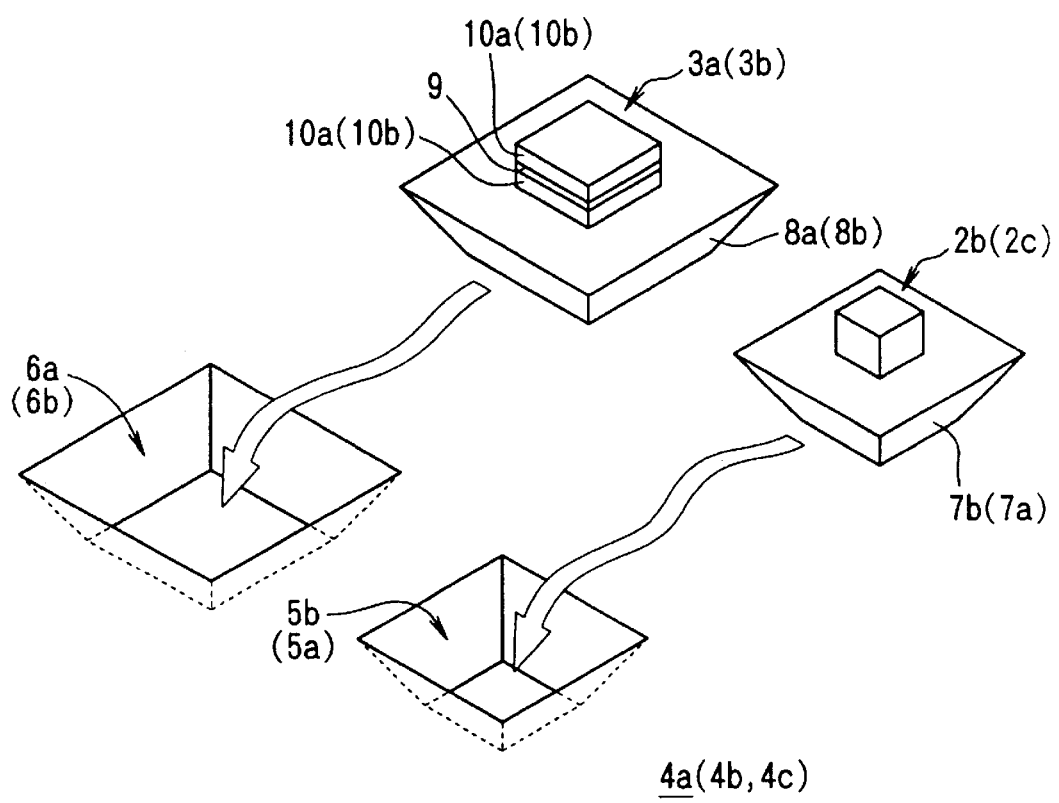
FIG. 2 is a diagram for explaining the operation of fitting the elements into the corresponding concave portions of each substrate.

In the substrates 4a to 4c of the IC chips 1a to 1c, concave portions 5b (or 5a) and 6a (or 6b) as shown in FIG. 2 are formed at positions where the light emitting elements 2a and 2b and the light receiving elements 3a and 3b are to be mounted. FIG. 2 shows the concave portions 5b and 5a formed in the IC chip 1a of the highest layer as representative examples. Each concave portion 5b and 6a has a shape having a larger top area, a smaller bottom area, and trapezoidal side faces. These concave portions 5b and 6a can be precisely formed by subjecting a relevant Si portion to anisotropic etching. In particular, anisotropic etching is very effective in precisely forming the slope of each side face. As clearly shown by FIG. 2, at least the concave portion 5b for the light emitting element and the concave portion 6a for the light receiving element have different forms, such as size or the like. Additionally, in the present embodiment, as shown in FIG. 1, the concave portions 6a and 6b for the light receiving element which are provided in the substrate 4b of the IC chip 1b in the middle layer have different forms, such as size, and the concave portion 6b for the light receiving element and the concave portion 5a for the light emitting element which are provided in the substrate 4c of the IC chip 1c in the lowest layer also have different forms such as size. That is, the concave portions having the same reference numeral (e.g., 6a or 6b) have the same form, such as size; however, the concave portions having different reference numerals have different forms, such as size. In other words, the concave portions for mounting elements having the same functions have the same form, while the concave portions for mounting elements having different functions have different forms.

FIG. 2 also shows a microstructure 7b (or 7a) on which the light emitting element 2b (or 2a) is provided and a microstructure 8a (or 8b) on which the light emitting element 3a (or 3b) is provided. The microstructures 7b (or 7a) and 8a (or 8b) are made of Si. Similar to the concave portions 5b (or 5a) and 6a (or 6b), each of the microstructures 7b (or 7a) and 8a (or 8b) has a shape having a larger top area, a smaller bottom area, and trapezoidal side faces, that is, a block shape. Here, the concave portion 5b for mounting the light emitting element 2b and the corresponding microstructure 7b on which the light emitting element 2b is provided have the same shape, and the concave portion 6a for mounting the light receiving element 3a and the corresponding microstructure 8a on which the light receiving element 3a is provided have the same shape. Similarly, the concave portion 5a for mounting the light emitting element 2a and the corresponding microstructure 7a on which the light emitting element 2a is provided have the same shape, and the concave portion 6b for mounting the light receiving element 3b and the corresponding microstructure 8b on which the light receiving element 3b is provided have the same shape. That is, the microstructures, on which elements having different functions are respectively provided, have different forms, such as size, but each microstructure has the same shape as that of the corresponding concave portion for mounting the element which is mounted on this microstructure.

The above-explained two kinds of light emitting elements 2a and 2b respectively comprise surface emitting lasers, each having a different wavelength of emitted light. In addition, the above-explained two kinds of light receiving elements 3a and 3b respectively comprise photodiodes, each having a filter corresponding to a different wavelength range for receiving light.

Figure 3A:
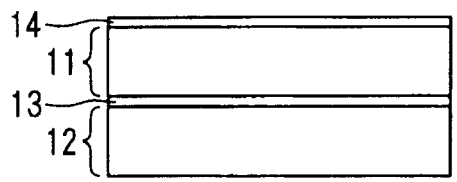
FIGS. 3A to 3F are diagrams for explaining the process of forming a microstructure on which a light emitting element is provided.

First, the process of manufacturing the microstructure 7a (or 7b) on which the light emitting element 2a (or 2b) (which comprises a surface emitting laser) will be explained. As shown in FIG. 3A, an epitaxial layer 11, in which a surface emitting laser element will be formed, is deposited on an Si substrate 12 via a p-contact layer 13. On a face on the opposite side of the epitaxial layer 11 relative to another face which contacts the p-contact layer 13, an n-contact layer 14 is formed in advance. In order to combine the epitaxial layer 11 with the Si substrate 12, known methods, such as forming an InP-Si direct junction, metal film inserting junction, soldering junction, adhesive junction, or the like, can be used.

Figure 3B:
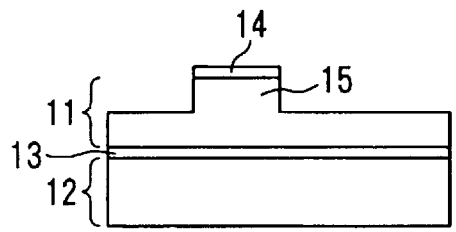
Figure 3C:
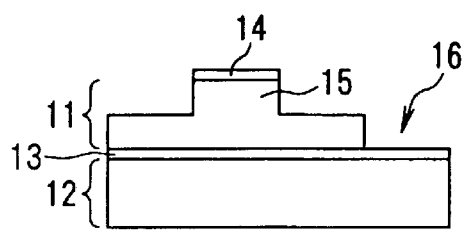
Figure 3D:
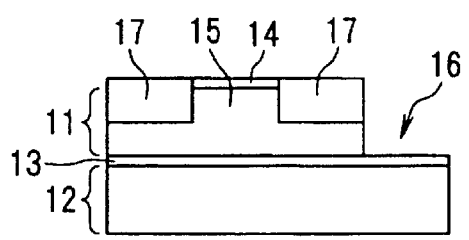
Figure 3E:
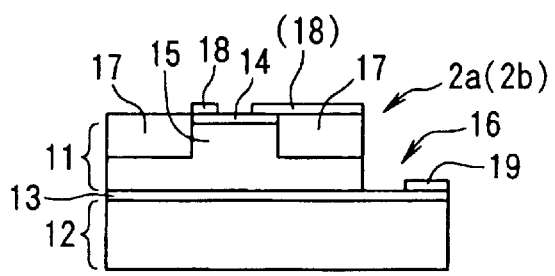
Figure 3F:
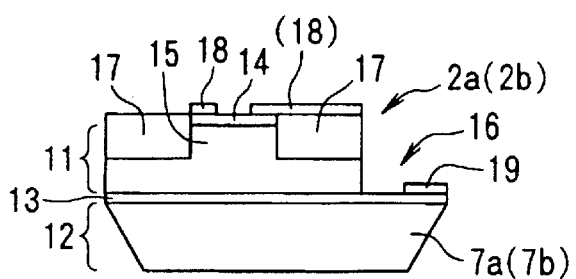

As shown in FIG. 3B, the epitaxial layer 11 is subjected to dry etching so as to form a pillar portion 15 which will function as a light emitting portion of the relevant surface emitting laser. Next, as shown in FIG. 3C, the remaining epitaxial layer 11 is subjected to dry etching so as to form a contact hole 16 and to expose a portion of the p-contact layer 13 as a common electrode. In the next step, as shown in FIG. 3D, an insulating layer 17 is formed by placing a polyimide material around the pillar portion 15. In the next step, as shown in FIG. 3E, a ring-shaped upper electrode 18 is formed on the n-contact layer 14, and a lower electrode 19 is formed on the p-contact layer 13 in the contact hole 16. In the final step, as shown in FIG. 3F, the Si substrate 12 is subjected to anisotropic etching so as to form the above-explained microstructure 7a (or 7b).

The light receiving elements 3a and 3b respectively have multilayered coatings 10a and 10b, where a normal photodiode 9 is placed between the layers of each multilayered coating. The multilayered coatings 10a and 10b have different wavelength ranges for the optical signal which passes through the coating. For example, a unit having multilayered coatings 10a and 10b between which a photodiode 9 is placed is combined with an Si substrate, and said unit is subjected to etching or the like so as to have a specific form; thereafter, the Si substrate is subjected to anisotropic etching so as to form microstructures 8a and 8b. Therefore, these multilayered coatings 10a and 10b function as band-pass filters for limiting the wavelength of each passing optical signal, thereby providing light receiving elements 3a and 3b which receive only light corresponding to a specific wavelength range.

Here, the multilayered coating 10a of the light receiving element 3a transmits light of a specific wavelength emitted from the surface emitting laser included in the light emitting element 2a but blocks light of another specific wavelength emitted from the surface emitting laser included in the light emitting element 2b. In contrast, the multilayered coating 10b of the light receiving element 3b transmits light of a specific wavelength emitted from the surface emitting laser included in the light emitting element 2b but blocks light of another specific wavelength emitted from the surface emitting laser included in the light emitting element 2a.

Figure 4:
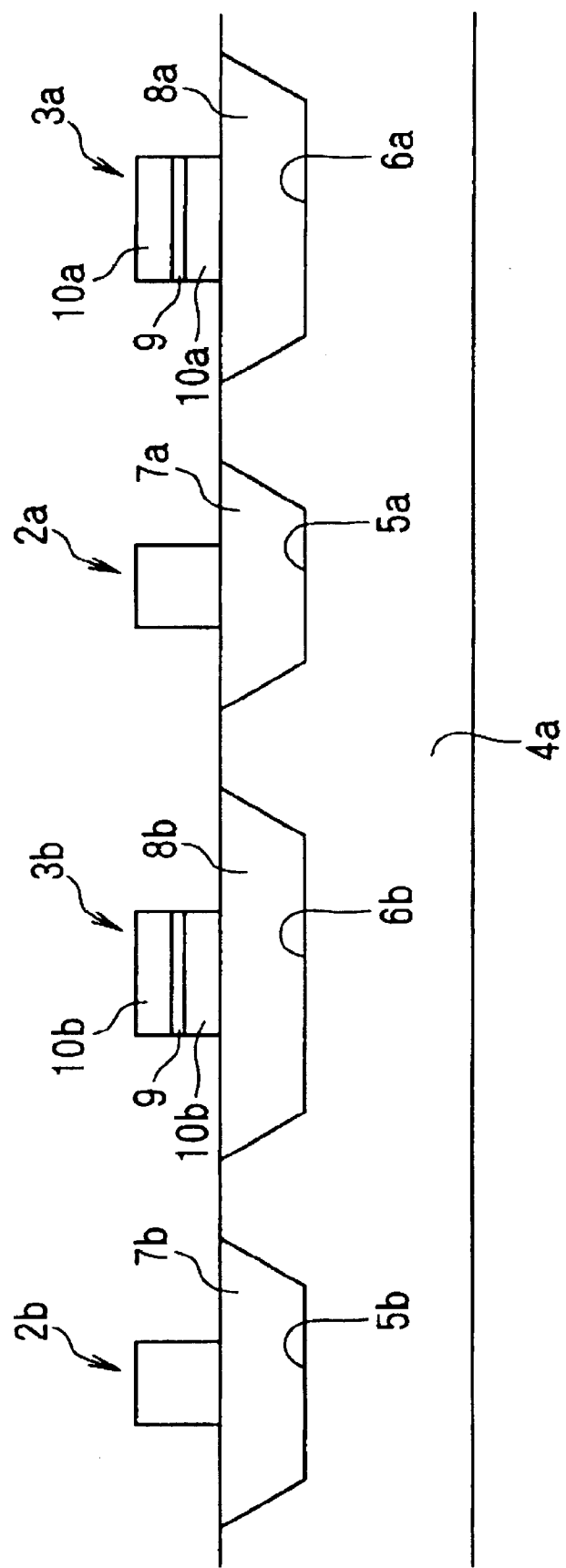
FIG. 4 is a diagram for showing a state in which elements having different functions are mounted on a substrate by using microstructures having different forms.

A slurry is obtained by putting the microstructure 7b (or 7a) on which the light emitting element 2b (or 2a) is provided and the microstructure 8a (or 8b) on which the light receiving element 3a (or 3b) is provided into a specific fluid (refer to U.S. Pat. No. 5,904,545), and this slurry is made to flow on the surface of the relevant substrate 4a (or 4b or 4c). Accordingly, as shown in FIG. 2, the microstructures 7b (or 7a) and 8a (or 8b) respectively fit into the concave portions 5b (or 5a) and 6a (or 6b) having the same shapes, due to gravity. That is, in the substrate 4a of the IC chip 1a of the highest layer, the microstructure 7b on which the light emitting element 2b is provided fits into the relevant concave portion 5b (onto which the light emitting element 2b should be mounted), and the microstructure 8a on which the light receiving element 3a is provided fits into the relevant concave portion 6a (onto which the light emitting element 3a should be mounted). Accordingly, as shown in FIG. 4, if (i) four different concave portions 5a, 5b, 6a, and 6b, as explained above, are formed on the substrate 4a of the IC chip 1a of the highest layer, (ii) a slurry is created by putting microstructures 7a and 7b, on which two different light emitting elements 2a and 2b as explained above are respectively provided, and microstructures 8a and 8b, on which two different light receiving elements 3a and 3b as explained above are respectively provided, into a fluid, and (iii) the slurry is made to flow on the surface of the substrate 4a, then the microstructures 7a, 7b, 8a, and 8b respectively fit into the concave portions 5a, 5b, 6a, and 6b having the corresponding forms, thereby mounting the desired elements at the desired positions.

When the light emitting and receiving elements are mounted by using such microstructures 7a, 7b, 8a, and 8b having different sizes, preferably, slurries, each including one of the microstructures (on which corresponding light emitting elements and light receiving elements are provided), which is selected according to its size (i.e., selected in order of the microstructures 8b, 8a, 7b, and 7a, that is, the largest microstructure 8b, the microstructure 8a which is smaller than 8b, ...), are made to flow in turn on the surface of the substrate 4a (or 4b or 4c), thereby mounting each of the light emitting elements and light receiving elements. Accordingly, it is possible to prevent a small microstructure, for example, 7b from fitting into a concave portion having a larger size, for example, 6a. This is because the larger microstructure 8a has already fit into the corresponding large concave portion 6a, and thus the concave portion 6a has been occupied.

After the light emitting and receiving elements 2a, 2b, 3a, and 3b are mounted on the substrates 4a to 4c, as explained above, necessary processes such as coating, forming of contact halls, wiring, and the like, are performed, and the IC chips 1a to 1c having these substrates 4a to 4c are stacked in a specific form. In the present embodiment, a transparent adhesive 21 is used for stacking the IC chips 1a to 1c. Accordingly, light emitted from the light emitting elements 2a and 2b pass through the substrates 4a to 4c and the adhesive 21 and reach the light receiving elements 3a and 3b. The light receiving elements 3a and 3b respectively receive light emitted from only the corresponding light emitting elements 2a and 2b. Therefore, even if light leaks from a relevant signal path, a light receiving element provided on another optical signal path does not erroneously receive the leaked light. Accordingly, crosstalk can be prevented and independent optical paths can be established.

As explained above, according to the process of mounting the elements of the present invention, elements having different functions can be precisely mounted at a very high density. In addition, the concave portions 5a, 5b, 6a, and 6b and microstructures 7a, 7b, 8a, and 8b formed by Si anisotropic etching have very accurate shapes; thus, even a very minute microstructure can be reliably fit into a corresponding concave portion having the same shape. Therefore, the desired elements can be very accurately mounted at the desired positions.

Figure 5:
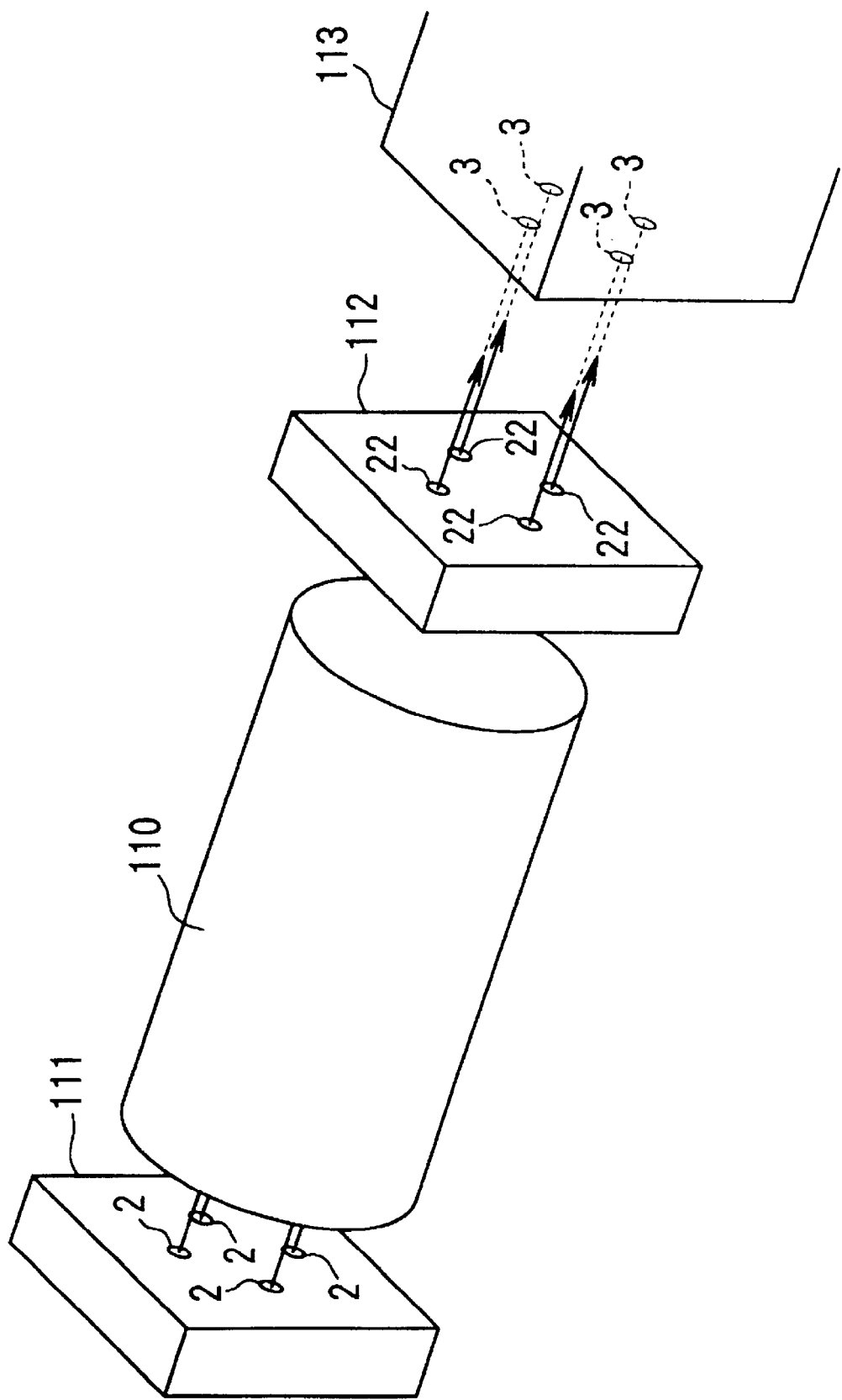
FIG. 5 is a diagram showing the general structure of a wavelength-division multiplexed optical interconnection apparatus, as an embodiment according to the present invention.

Below, an embodiment of applying the process of mounting elements and the optical transmitting apparatus of the present invention to a wavelength-division multiplexed optical interconnection apparatus will be explained. The wavelength-division multiplexed optical interconnection apparatus may have the structure shown in FIG. 5. This example is similar to a structure disclosed in Japanese Unexamined Patent Application, First Publication No. Hei 11-289317. The structure shown in FIG. 5 comprises a light emitting element array 111 having a plurality of light emitting elements 2 each having a different wavelength, an optical fiber 110 which functions as an optical waveguide, a filter array 112 having filter elements 22 for respectively receiving light emitted from the light emitting elements 2 each of which has a different wavelength, and a light receiving element array 113 having light receiving elements 3 for respectively receiving light of the different wavelengths passing through the filter array 112. In FIG. 5, each component is separately shown so as to be easily understood; however, practically, the components are optically and directly coupled with each other.

In the above-explained wavelength-division multiplexed optical interconnection apparatus, (i) a plurality of optical signals (i.e., light) each having a different wavelength are emitted from the corresponding light emitting elements 2 of the light emitting element array 111, (ii) each optical signal is transmitted through the optical fiber 110 as a transmitting medium, and (iii) each optical signal having a specific wavelength is extracted from light output from the optical fiber 110 and is received by the corresponding light receiving element 3 of the light receiving element array 113, thereby transmitting data via the transmitted light.

Also in this case, the light emitting elements 2 or the light receiving elements 3 have different functions, that is, different wavelength characteristics of emitted or received light, and thus each element must be mounted on the relevant array. In addition, even if an optical fiber having a large diameter is used, the diameter of the core through which light passes is small; thus, it is very difficult to precisely mount the light emitting elements 2 and light receiving elements 3 within the diameter of the core at a high density.

Therefore, in the present embodiment, microstructures, on which the light emitting elements and light receiving elements used for the above-explained optical interconnection apparatus (for interconnection between stacked IC chips) are provided, are used for mounting these light emitting elements and light receiving elements. Here, each light receiving element has a filtering function for receiving light having a specific wavelength; therefore, the filter array 112 is practically unnecessary.

Accordingly, as shown in FIG. 6A, concave portions 5c to 5f having different shapes are formed in the substrate of the light emitting element array 111, and a slurry is created by putting microstructures 7c to 7f, which respectively have the same shapes as those of the concave portions 5c to 5f and on which light emitting elements 2c to 2f are provided, into a fluid. This slurry is made to flow on the surface of the relevant substrate so as to fit the microstructures 7c to 7f into the corresponding concave portions 5c to 5f. Accordingly, the light emitting elements 2c to 2f are mounted on the substrate of the light emitting element array 111.

On the other hand, as shown in FIG. 6B, concave portions 6c to 6f having different shapes are formed in the substrate of the light receiving element array 113, and a slurry is created by putting microstructures 8c to 8f, which respectively have the same shapes as those of the concave portions 6c to 6f and on which light receiving elements 3c to 3f are provided, into a fluid. This slurry is made to flow on the surface of the relevant substrate so as to fit the microstructures 8c to 8f into the corresponding concave portions 6c to 6f. Accordingly, the light receiving elements 3c to 3f are mounted on the substrate of the light receiving element array 113.

As explained above, similar to the previous embodiment, a plurality of elements having different functions can be very precisely mounted at a very high density. In addition, the concave portions and microstructures formed by Si anisotropic etching have very accurate shapes; thus, even a very minute microstructure can be reliably fit into a corresponding concave portion having the same shape. Therefore, the desired elements can be very accurately mounted at the desired positions.

In the above-explained embodiments, each microstructure has a shape in which its top and bottom faces have square shapes and its side faces have trapezoidal shapes. However, the shape of the microstructure is not limited to this example, and the top and bottom faces may have rectangular, parallelogram, or rhomboidal shapes.

What is claimed is:

1. A process of mounting elements, comprising the steps of:

forming concave portions having different sizes at predetermined positions on a surface of a base;

forming microstructures on which elements having different functions are provided, the microstructures having different sizes corresponding to the sizes of the concave portions;

putting the microstructures into fluids to create a plurality of slurries, each slurry containing one size of the microstructures; and fitting the microstructures into the concave portions by making the plurality of slurries consecutively flow over the surface of the base in order of the size of the microstructure contained in the slurries from largest to smallest.

2. The process as claimed in claim 1, wherein:

the elements having different functions further comprise light emitting elements, each light emitting element emitting light of a different wavelength; and the step of filling the microstructures into the concave portions includes mounting the light emitting elements at said predetermined positions on the surface of the base.

3. The process as claimed in claim 1, wherein:

the elements having different functions further comprise light receiving elements, each light receiving element receiving light of a different wavelength; and the step of fitting the microstructures into the concave portions includes mounting the light receiving elements at said predetermined positions on the surface of the base.

4. The process as claimed in claim 3, wherein:

the light receiving elements further comprise photodiodes, each photodiode having a light receiving surface on which a band-pass filter is provided.

5. The process as claimed in claim 1, wherein:

the elements having different functions are selected from the group consisting of light emitting elements and light receiving elements, each light emitting element emitting light of a different wavelength, and each light receiving element receiving light of a different wavelength; and the step of fitting the microstructures into the concave portions includes mounting the selected elements at said predetermined positions on the surface of the base.

6. The process as claimed in claim 5, wherein the light receiving elements further comprise photodiodes, each photodiode having a light receiving surface on which a band-pass filter is provided.

7. The process as claimed in claim 5, wherein:

said step of forming concave portions further comprises forming said concave portions having different sizes at predetermined positions on the surfaces of a plurality of bases, each base having the elements having different functions mounted thereon;

the elements mounted on said plurality of bases including both the light emitting elements and the light receiving elements; and the method further comprises the step of:

stacking said plurality of bases so that the light emitting elements respectively face the light receiving elements which receive light emitted from the corresponding light emitting elements.

* * * * *

UNITED STATES PATENT AND TRADEMARK OFFICE
CERTIFICATE OF CORRECTION

PATENT NO. : 6,599,769 B2 Page 1 of 1
DATED : July 29, 2003
INVENTOR(S) : Kondo et al.

It is certified that error appears in the above-identified patent and that said Letters Patent is hereby corrected as shown below:

<u>Title page, Item [54] and Column 1, line 1,</u>
Title, "DEVICE" should be -- ELEMENTS --;

<u>Title page,</u>
Item [75], Inventors, "Tatsuya Shimoda, Suwa" should be -- Fujimi-cho --;

<u>Column 4,</u>
Line 54, delete "a";

<u>Column 9,</u>
Line 39, "filling" should read -- fitting --.

Signed and Sealed this

Second Day of December, 2003

JAMES E. ROGAN
*Director of the United States Patent and Trademark Office*